(12) United States Patent
Nakano et al.

(10) Patent No.: US 7,555,960 B2
(45) Date of Patent: Jul. 7, 2009

(54) OCCUPANT LOAD SENSOR FOR A VEHICLE SEAT WITH FLEXIBLE PRINTED CIRCUITRY

(75) Inventors: Satohiko Nakano, Chiryu (JP); Muneto Inayoshi, Nagoya (JP); Mutsuro Aoyama, Nagoya (JP); Satoshi Sato, Nagano-ken (JP); Hirofumi Otsuka, Nagano-ken (JP)

(73) Assignees: Aisin Seiki Kabushiki Kaisha, Kariya-shi, Aichi-ken (JP); Minebea Co., Ltd., Kitasaku-gun, Nagano-ken (JP)

( * ) Notice: Subject to any disclaimer, the term of this patent is extended or adjusted under 35 U.S.C. 154(b) by 0 days.

(21) Appl. No.: 11/930,488

(22) Filed: Oct. 31, 2007

(65) Prior Publication Data

US 2008/0127752 A1 Jun. 5, 2008

(30) Foreign Application Priority Data

Oct. 31, 2006 (JP) ............................. 2006-296867
Oct. 19, 2007 (JP) ............................. 2007-272391

(51) Int. Cl.
*G01L 1/22* (2006.01)
(52) U.S. Cl. .................................... 73/781; 73/862.474
(58) Field of Classification Search .................... 73/781, 73/862.474
See application file for complete search history.

(56) References Cited

U.S. PATENT DOCUMENTS

| 6,242,701 | B1 | 6/2001 | Breed et al. | |
| 6,477,904 | B2 * | 11/2002 | Maeda et al. | .......... 73/862.044 |
| 7,155,981 | B2 | 1/2007 | Matsuura et al. | |
| 7,189,931 | B2 | 3/2007 | Hida et al. | |

(Continued)

FOREIGN PATENT DOCUMENTS

JP 2003-083707 A 3/2003

(Continued)

OTHER PUBLICATIONS

Rasul, Jad S. "Printed Wiring Board Technology." Wiley Encyclopedia of Electrical and Electronics Engineering. J. Webster ed. 1999.*

(Continued)

*Primary Examiner*—Lisa M Caputo
*Assistant Examiner*—Punam Patel
(74) *Attorney, Agent, or Firm*—Buchanan Ingersoll & Rooney PC

(57) ABSTRACT

An occupant load sensor of a seat for a vehicle includes a strain member, a connecting member, first and second strain gauge plates, an upper bracket, an amplifier substrate, and an FPC substrate. The strain gauge plates are attached to a surface of the strain member and respectively arranged between a central portion and both end portions of the strain member. Each strain gauge plate includes two strain detecting elements forming a half bridge circuit of a Wheatstone bridge circuit. The FPC substrate is connected to the amplifier substrate and to the strain gauge plates between the both end portions and the central portion of the strain member. Further, the FPC substrate includes a plurality of wiring patterns. The Wheatstone bridge circuit is formed with the plurality of wiring patterns and the half bridge circuit formed at each strain gauge plates.

14 Claims, 7 Drawing Sheets

U.S. PATENT DOCUMENTS

| | | |
|---|---|---|
| 2002/0134167 A1* | 9/2002 | Rainey et al. ................ 73/795 |
| 2003/0106723 A1 | 6/2003 | Thakur et al. |
| 2005/0023065 A1* | 2/2005 | McBride et al. ............ 180/273 |
| 2006/0144630 A1 | 7/2006 | Breed et al. |
| 2006/0169837 A1* | 8/2006 | Bird et al. ................. 244/99.8 |
| 2006/0185446 A1 | 8/2006 | Speckhart |
| 2008/0036185 A1 | 2/2008 | Breed |
| 2008/0084086 A1 | 4/2008 | Endo et al. |
| 2008/0098822 A1 | 5/2008 | Sakamoto et al. |
| 2008/0098823 A1 | 5/2008 | Sumi et al. |
| 2008/0156103 A1 | 7/2008 | Nakano et al. |

FOREIGN PATENT DOCUMENTS

| | | |
|---|---|---|
| JP | 2004-69535 A | 3/2004 |
| JP | 2004-268620 A | 9/2004 |
| JP | 2006-038812 A | 2/2006 |
| WO | WO 2005/080931 A1 | 9/2005 |
| WO | WO 2006/011597 A1 | 2/2006 |

OTHER PUBLICATIONS

U.S. Appl. No. 12/203,452, filed Sep. 3, 2008, Kawabata, et al.

U.S. Appl. No. 12/262,418, filed Oct. 31, 2008, Ito, et al.

\* cited by examiner

OCCUPANT LOAD SENSOR FOR A VEHICLE SEAT WITH FLEXIBLE PRINTED CIRCUITRY

CROSS REFERENCE TO RELATED APPLICATIONS

This application is based on and claims priority under 35 U.S.C. § 119 to Japanese Patent Application 2006-296867, filed on Oct. 31, 2006 and Japanese Patent Application 2007-272391, filed on Oct. 19, 2007, the entire content of which is incorporated herein by reference.

FIELD OF THE INVENTION

The present invention relates to an occupant load sensor of a seat for a vehicle, which is arranged between a seat side fixing member and a floor side fixing member for fixing the seat to a floor of a vehicle, for measuring a load of an occupant seated on the seat for the vehicle.

BACKGROUND

As one of the known arts of an occupant load sensor, a strain sensor is disclosed in Japanese Patent No. 2003-83707A (hereinafter, referred to as reference 1). According to the strain sensor in reference 1, a detecting member is press-fitted into a detecting hole provided at an intermediate portion of the sensor substrate (strain member), and first and second fixing members are press-fitted into first and second fixing holes provided at both sides of the detecting hole, respectively. In addition, first and fourth strain detecting elements are provided between the detecting hole and the first fixing hole, while second and third strain detecting elements are provided between the detecting hole and the second fixing hole. Then, first to fourth strain detecting elements are connected by circuit patterns, so that a Wheatstone bridge is structured. An output from the Wheatstone bridge circuit is connected to an amplifying circuit provided at an upper surface of the sensor substrate (strain member). An output from the amplifying circuit is connected to an output electric pole provided at an end portion of the sensor substrate with an external power electric pole and an external GND electric pole.

According to the strain sensor disclosed in the reference 1, when an external force is applied to the detecting members, a component force is applied to the first and second fixing members and a strain is generated to the sensor substrate. The strain is detected as a resistance change of each strain detecting element. The resistance change is transformed to electric voltage in the Wheatstone bridge. In addition, an output electric voltage from the Wheatstone bridge is amplified by an amplifying circuit and outputted to an outside as a sensor output via the external output electric pole.

However, according to the strain sensor disclosed in the reference 1, not only the Wheatstone bridge circuit but also wiring patterns, for connecting the Wheatstone bridge with the external power electric pole and the external GND electric pole with the external output electric pole, are formed on the sensor substrate. Therefore, when the sensor substrate is deformed receiving the strain, the wiring patterns formed on the sensor substrate are also deformed. Accordingly, there is a possibility that the sensor output from the external output electric pole is influenced. Further, the strain detecting elements on the sensor substrate and the wiring patterns are desired to be arranged so as not to be in contact with one another, which may cause a need for a large space.

A need thus exists for an occupant load detecting sensor of a seat for a vehicle which is not susceptible to the drawback mentioned above.

SUMMARY OF THE INVENTION

According to an aspect of the present invention, an occupant load sensor of a seat for a vehicle includes a strain member, a connecting member, first and second strain gauge plates, an upper bracket, an amplifier substrate, and an FPC substrate. The strain member is arranged between a floor-side fixing member adapted to be fixedly mounted on a floor and a seat-side fixing member adapted to be fixedly attached to a seat for the vehicle, and is securely attached to one of the floor-side fixing member and the seat-side fixing member at both end portions in a front and rear direction of the seat. The connecting member is fixed to a central portion of the strain member in a vertical direction of the seat, and is securely connected to the other one of the floor-side fixing member and the seat-side fixing member. The first and second strain gauge plates are attached to a surface of the strain member and respectively arranged between the central portion and the both end portions of the strain member. Each of the first and second strain gauge plate includes two strain detecting elements, which form a half bridge circuit of a Wheatstone bridge circuit. The upper bracket includes fixing portions which are respectively formed at end portions of the upper bracket and fixed to the both end portions of the strain member. The upper bracket is further formed with an attachment portion which connects the fixing portions of the upper bracket and extends at the side of the strain member in a lateral direction of the seat. The amplifier substrate is housed in an amplifier case, which is attached in parallel with the attachment portion of the upper bracket, and amplifies a signal of the strain gauge plates. The FPC substrate is connected to the amplifier substrate and to the strain gauge plates between the both end portions and the central portion of the strain member. Further, the FPC substrate includes a plurality of wiring patterns which forms the Wheatstone bridge circuit with each half bridge circuit of the Wheatstone bridge circuit formed at each first and second strain gauge plate.

BRIEF DESCRIPTION OF THE DRAWINGS

The foregoing and additional features and characteristics of the present invention will become more apparent from the following detailed description considered with reference to the accompanying drawings, wherein.

DETAILED DESCRIPTION

Figure 1:
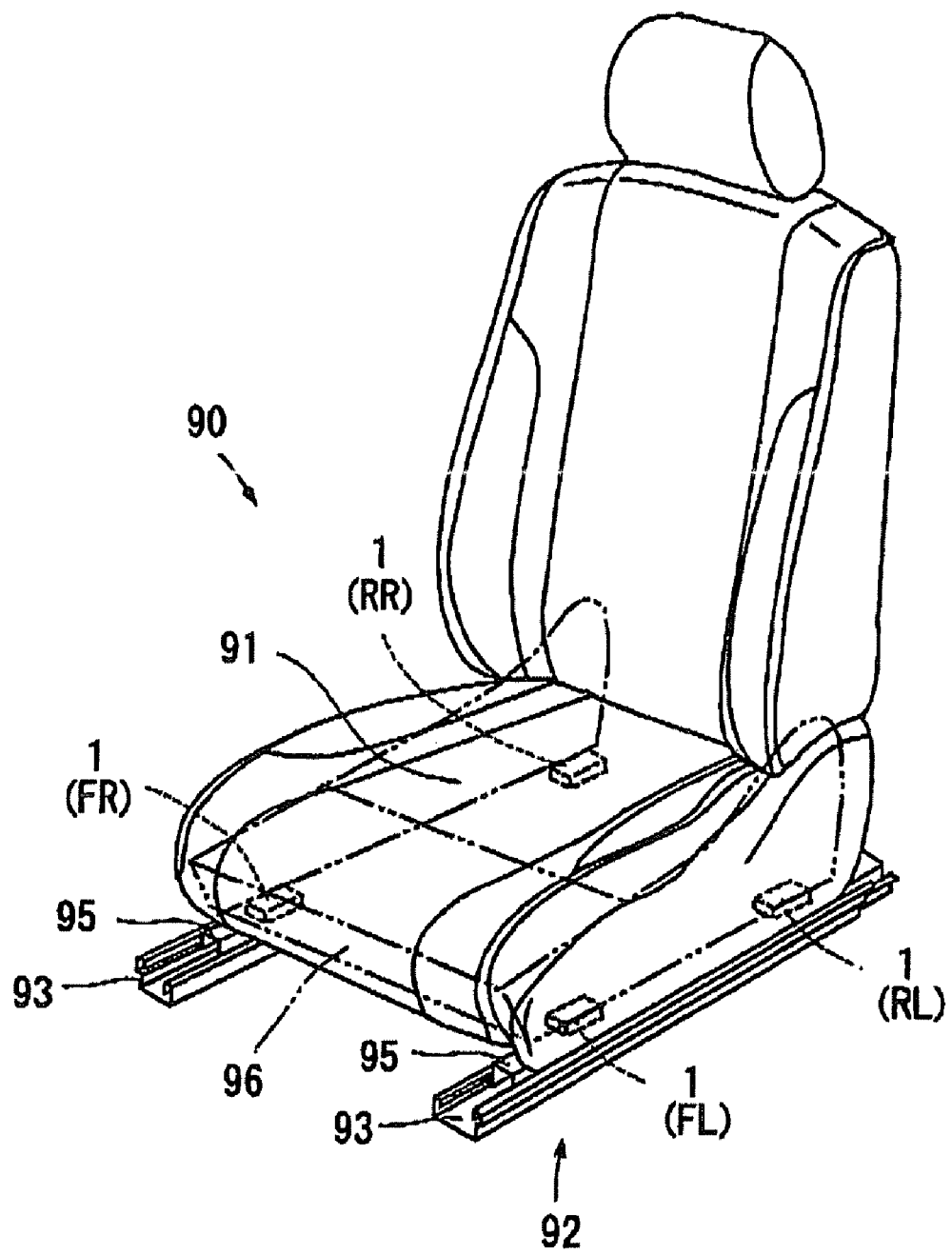
FIG. 1 is a perspective view illustrating a seat for a vehicle adapted with an occupant load sensor according to an embodiment of the present invention.

Described below are occupant load sensors of a seat for a vehicle according to an embodiment of the present invention, with reference to the attached drawings. The occupant load sensor, which is generally indicated at numeral 1, is configured to measure a load of an occupant seated on a seat 90 for a vehicle illustrated in FIG. 1. Four occupant load sensors 1 (FR, FL, RR, RL) are provided at four corners of a lower portion of a seat cushion 91 of the seat 90, respectively. More specifically, with reference to FIG. 1, a seat sliding apparatus 92 is configured to secure the seat 90 to a vehicle floor 99 in a manner that the seat 90 is positioned in a front and rear direction (serving as a longitudinal direction) of the vehicle. The seat sliding apparatus 92 includes: a pair of lower rails 93 fixedly mounted on the floor 99 and extending in a front and rear direction (serving as a longitudinal direction) of the seat 90; and a pair of upper rails 95 slidably supported by the lower rails 93. In addition, a lower portion of the seat cushion 91 is structured with a frame 96. Among the four corners of the lower surface of the frame 96, two of the corners arranged in the longitudinal direction are fixed to one of the upper rails 95 (right upper rail 95) via two of the occupant load sensors 1 (FR, RR). The other two of the four corners arranged in the longitudinal direction are fixed to the other one of the upper rails 95 (left upper rail 95) via the other two of the occupant load sensors 1 (FL, RL). Here, each upper rail 95 serves as a floor side fixing member and the frame 96 serves as a seat side fixing member.

Figure 2:
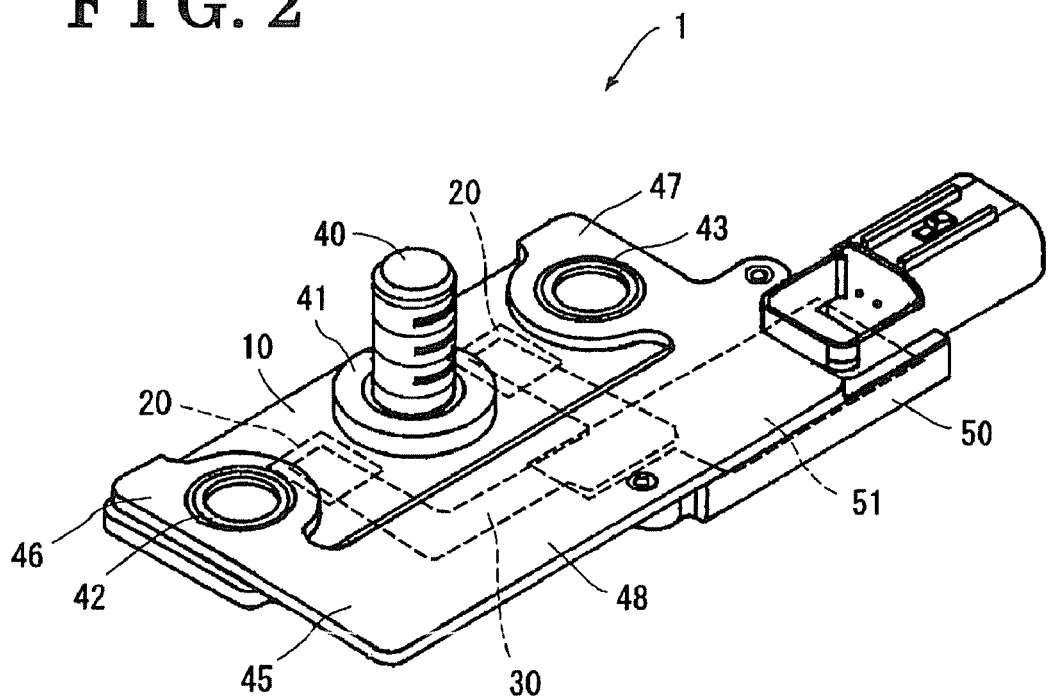
FIG. 2 is a perspective view illustrating the occupant load sensor of the seat for the vehicle according to the embodiment.
Figure 3:
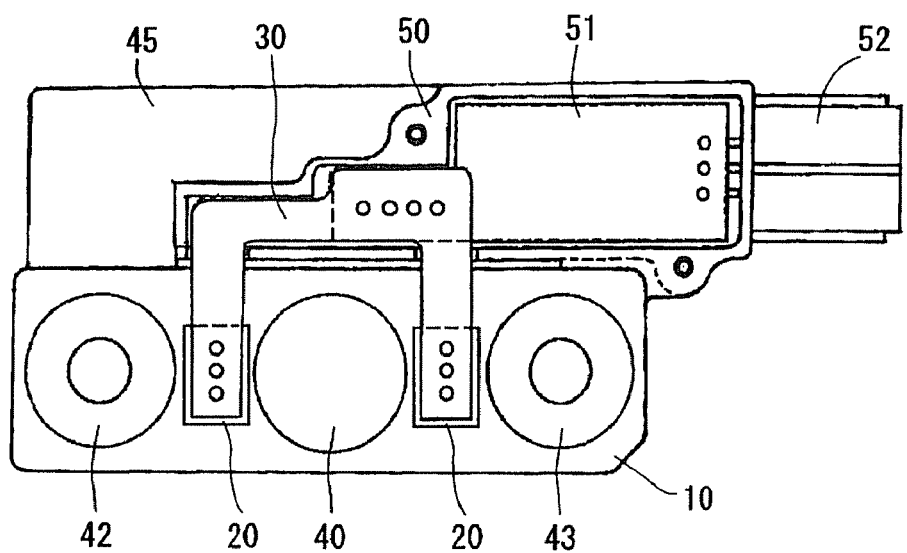
FIG. 3 is a front view illustrating the occupant load sensor according to the embodiment of the present invention.

Next, with reference to FIGS. 2 and 3, the occupant load sensors 1 will be described hereinafter. The occupant load sensor 1 illustrated in FIG. 2 is to be attached to a front portion of a right upper rail 95 (FR). The occupant load sensor 1 illustrated in FIG. 3 is another one to be attached to a rear portion of a left upper rail 95 (RL). With respect to the other two occupant load sensors 1, among which the one is to be attached to a front portion of the left upper rail 95 (FL) and the other is to be attached to a rear portion of the right upper rail 95 (RR), each position of an amplifier case 50 relative to each later-described strain member 10, of the corresponding occupant load sensor 1, is different.

As best shown in FIGS. 2 and 3, each occupant load sensor 1 includes a strain member 10, a connecting shaft 40 serving as a connecting member, strain gauge plates 20 (serving as first and second strain gauge plates), an upper bracket 45, an amplifier substrate 51 and an Flexible Printed Circuits substrate 30 (hereinafter referred to as FPC substrate 30). The strain member 10 is fixed to each upper rail 95, at its both end portions, which are orientated in the front and rear direction of the seat 90 corresponding to the front and rear direction of the vehicle. The connecting shaft 40 is fixed to an intermediate portion of the strain member 10 and securely attached to the frame 96 in a vertical direction of the seat for the vehicle (see FIG. 1). The strain gauge plates 20 are included at a surface of the strain member 10, and are respectively attached to the areas between the central portion of the strain member 10 and both ends thereof. Each strain gauge plate 20 includes two strain detecting elements forming a half-bridge circuit, the strain detecting elements which will be described later. The upper bracket 45 includes, at its both end portions, fixing portions 46 and 47. The fixing portions 46 and 47 are fixedly attached to the both end portions of the strain member 10 by first and second lower bracket 42 and 43, respectively, hence the upper bracket 45 is fixed to the strain member 10. Further, the upper bracket 45 is formed with an attachment portion 48 which connects the fixing portions 46 and 47 and extends at the side of the strain member 10 in a lateral direction of the seat 90, a lateral direction being perpendicular to the longitudinal direction. The amplifier substrate 51 amplifies a signal transmitted from the strain gauge plates 20, and then, converts the signal to a digital signal and sends it to an outside. The amplifier substrate 51 is housed in the amplifier case 50, which is arranged at the side of the strain member 10 laterally in parallel therewith and attached to the attachment portion 48 of the upper bracket 45 together with the strain member 10. In addition, the amplifier substrate 51 includes: an amplifying circuit for amplifying the signal of the strain gauge plates 20; an A/D (analog/digital) converter circuit for converting a voltage output of the amplifying circuit to the digital signal; and a sending circuit for sending the digital signal to the outside. In addition, the FPC (Flexible Printed Circuits) substrate 30 is connected to the strain member 10 in a manner that end portions thereof are respectively attached to the strain gauge plates 20, i.e., to the areas between the central portion of the strain member 10 and both ends thereof. The FPC substrate 30 is connected also to the amplifier substrate 51.

Figure 4:
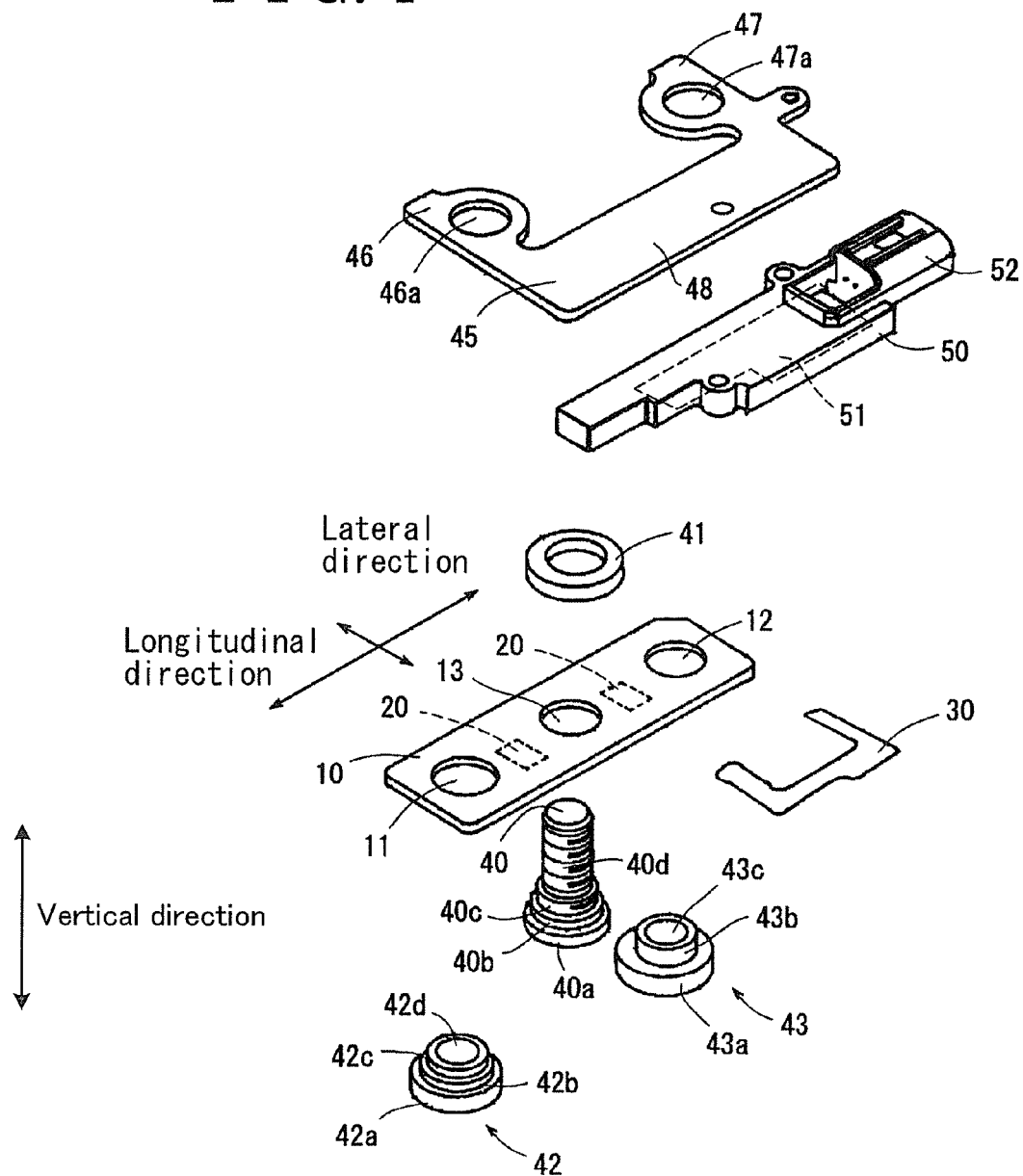
FIG. 4 is an exploded perspective view illustrating the occupant load sensor according to the embodiment of the present invention.

FIG. 4 is an exploded perspective view of the occupant load sensor 1. The occupant load sensor 1 will be described herein in detail in particular with reference to FIG. 4. The first lower bracket 42 is structured with: a base portion 42a having a predetermined thickness in the vertical direction; an intermediate shaft portion 42b upwardly protruding from the base portion 42a and pressed into a first hole 11 defined at one end of the strain member 10; an upper shaft portion 42c upwardly protruding from the intermediate shaft portion 42b; and an attachment hole 42d defined at the center of the first lower bracket 42 and penetrating therethrough. The second lower bracket 43 is structured with: a base portion 43a having a predetermined thickness in the vertical direction; a shaft portion 43b upwardly protruding from the base portion 43a and loosely inserted into a second hole 12 defined at the other end of the strain member 10; and an attachment hole 43c defined at the center of the second lower bracket 43 and penetrating therethrough.

The first and second holes 11 and 12 are formed at both ends of each strain member 10. In cases where the first and second lower brackets 42, 43 are fitted into the strain member 10, the base portion 42a of the first lower bracket 42 and the base portion 34a of the second lower bracket 43 come in contact with the lower surface of the strain member 10. In this case, the intermediate shaft portion 42b of the first lower bracket 42 is press-fitted into the first hole 11 of the strain member 10, while the shaft portion 43b of the second lower bracket 43 is loosely inserted into the second hole 12 of the strain member 10. The strain member 10 is further formed, at its center, with an intermediate hole 13, into which an intermediate shaft portion 40b of the connecting shaft 40 is press-fitted. The connecting shaft 40 includes, at its end, a flange portion 40a having a smaller thickness than the thicknesses of the base portions 42a, 43a of the first and second lower brackets 42, 43. The flange portion 40a of the connecting shaft 40 comes in contact with the surface of the strain member 10 when the connecting shaft 40 is press-fitted into the intermediate hole 13 of the strain member 10. The connecting shaft 40 further includes an upper shaft portion 40c protruding from the upper surface of the intermediate shaft portion 40*b*, and a fixing threaded portion 40*d* protruding from the upper surface of the upper shaft portion 40*c*. The upper shaft portion 40*c* of the connecting shaft 40 is press-fitted into a center bracket 41 in a state where the intermediate shaft portion 40*b* of the connecting shaft 40 is press-fitted into the intermediate hole 13 of the strain member 10. So configured, the connecting shaft 40 is firmly attached to the strain member 10 at its base portion while the strain member 10 is being interposed between the flange portion 40*a* of the connecting shaft 40 and the center bracket 41. Directions, such as longitudinal direction, lateral direction and vertical direction, of the strain member 10, are indicated with arrows illustrated in FIG. 4, the directions which correspond to the directions of the seat 90 for the vehicle.

When the load of the occupant seated on the seat 90 is applied to the strain member 10 via the connecting shaft 40, the strain member 10 is flexibly bent while being supported at both ends thereof by the first and second lower brackets 42, 43. Therefore, at each area between the connecting shaft 40 and each first and second lower bracket 42, 43 on the surface of the strain member 10, compressive strain is generated at the side of the first and second brackets 42, 43, and tensile strain is generated at the side of the connecting shaft 40. The compressive strain and the tensile strain are proportional to the load of the occupant applied to the strain member 10. The occupant load sensor 1 can be set in a manner where the compressive strain or the tensile strain is generated only at the side of the first and second brackets 42, 43, in addition to the case where the compressive strain is generated at the side of the first and second brackets 42, 43 and the tensile strain is generated at the side of the connecting shaft 40 as described above. In order to detect such compressive strain and the tensile strain, the strain gauge plates 20 are respectively attached to the areas between the central portion of the strain member 10 and both ends of the strain member 10, i.e., to each area between the connecting shaft 40 and each of the first and second lower bracket 42, 43 on the surface of the strain member 10.

The upper bracket 45 is fixedly assembled on the upper surface of the strain member 10 at the both ends of the strain member 10. The upper bracket 45 is provided with the fixing portions 46, 47 at both ends, at which fixing through-holes 46*a*, 47*a* are formed respectively. The upper shaft portion 42*c* of the first lower bracket 42 is press-fitted into the fixing through-hole 46*a*. The intermediate shaft portion 43*b* of the second lower bracket 43 is press-fitted into the fixing through-hole 47*a*. The strain member 10 is hence sandwiched and fixed at its both ends between the fixing portions 46, 47 of the upper bracket 45 and the base portions 42*a*, 43*a* of the first and second lower brackets 42, 43. The upper bracket 45 is formed with the attachment portion 48, which connects the fixing portions 46 and 47 formed at the both ends of the upper bracket 45, in a manner where the attachment portion 48 extends at the side of the strain member 10 in a lateral direction of the seat 11. When the fixing portions 46, 47 of the upper bracket 45 are overlapped by the strain member 10, but the attachment portion 48 of the upper bracket 45 is not overlapped by the strain member 10, i.e., nor by the strain gauge plates 20 and a substrate 21 (described later), the upper bracket 45 does not affect the flexible deformation of the strain member 10. Therefore, it is possible to measure precisely the load of the occupant.

The attachment portion 48 of the upper bracket 45 is attached with the amplifier case 50, which is made of resin, for example, in a manner where the amplifier case 50 is arranged at the side of the strain member 10. The amplifier substrate 51 is housed in the amplifier case 50. Further, a connector 52 is provided at the amplifier case 50. The connector 52 supplies electricity from the outside source and also sends the digital signal outputted from the amplifier substrate 51 to the outside. Still further, as illustrated in FIG. 3, the amplifier substrate 51 and the strain gauge plates 20 are connected via the FPC substrate 30.

Figure 5:
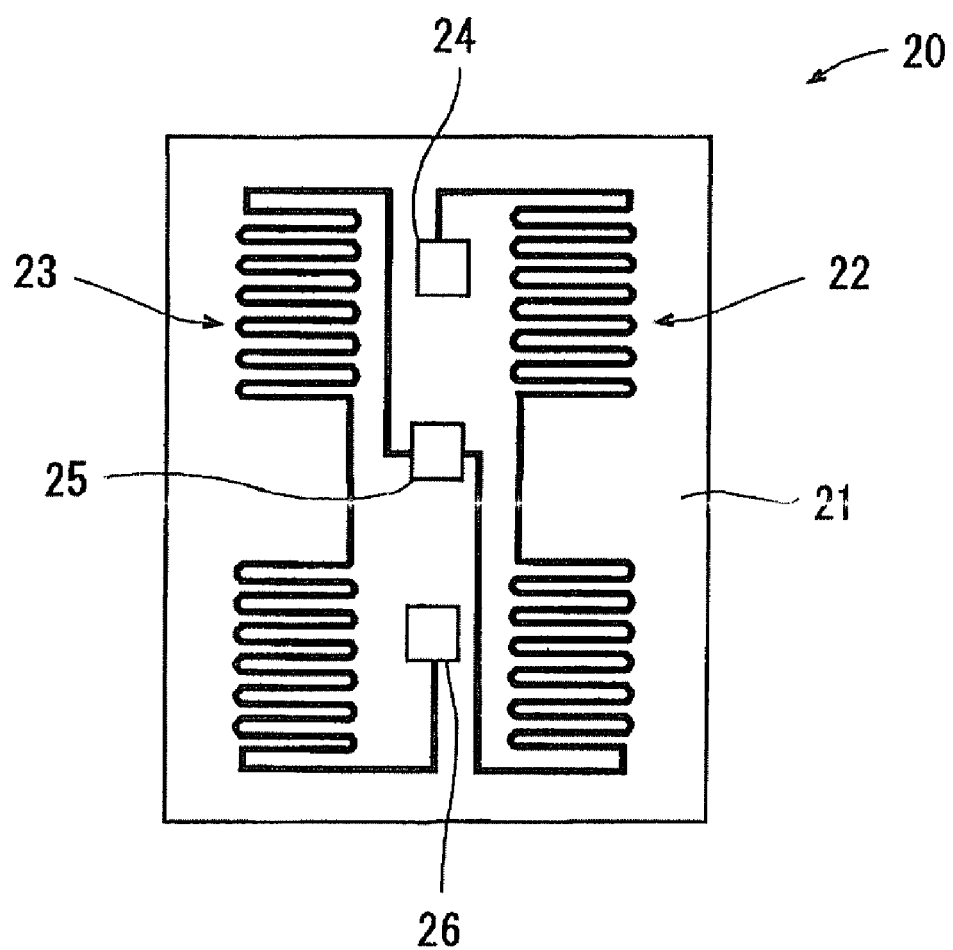
FIG. 5 is a front view illustrating a strain gauge plate of the occupant load sensor according to the embodiment of the present invention.

As illustrated in FIG. 5, each strain gauge plate 20 is rectangular in shape. Further, the strain gauge plates 20 includes the substrate 21 and the strain detecting elements 22 and 23 formed on the substrate 21. Still further, each strain gauge plate 20 further includes electric terminals (lands) 24, 25 and 26 protruding from the substrate 21. In this case, the electric terminals (lands) 24, 25 and 26 are aligned at a central portion of each strain gauge plate 20. On the substrate 21, one end of the strain detecting element 22 is connected to the electric terminal (land) 24 and the other end of the strain detecting element 22 is connected to the electric terminal (land) 25. In the same manner, one end of the strain detecting element 23 is connected to the electric terminal (land) 25 and the other end of the strain detecting element 23 is connected to the electric terminal (land) 26. Therefore, a half bridge circuit HB is formed on each strain gauge plate 20.

Figure 6:
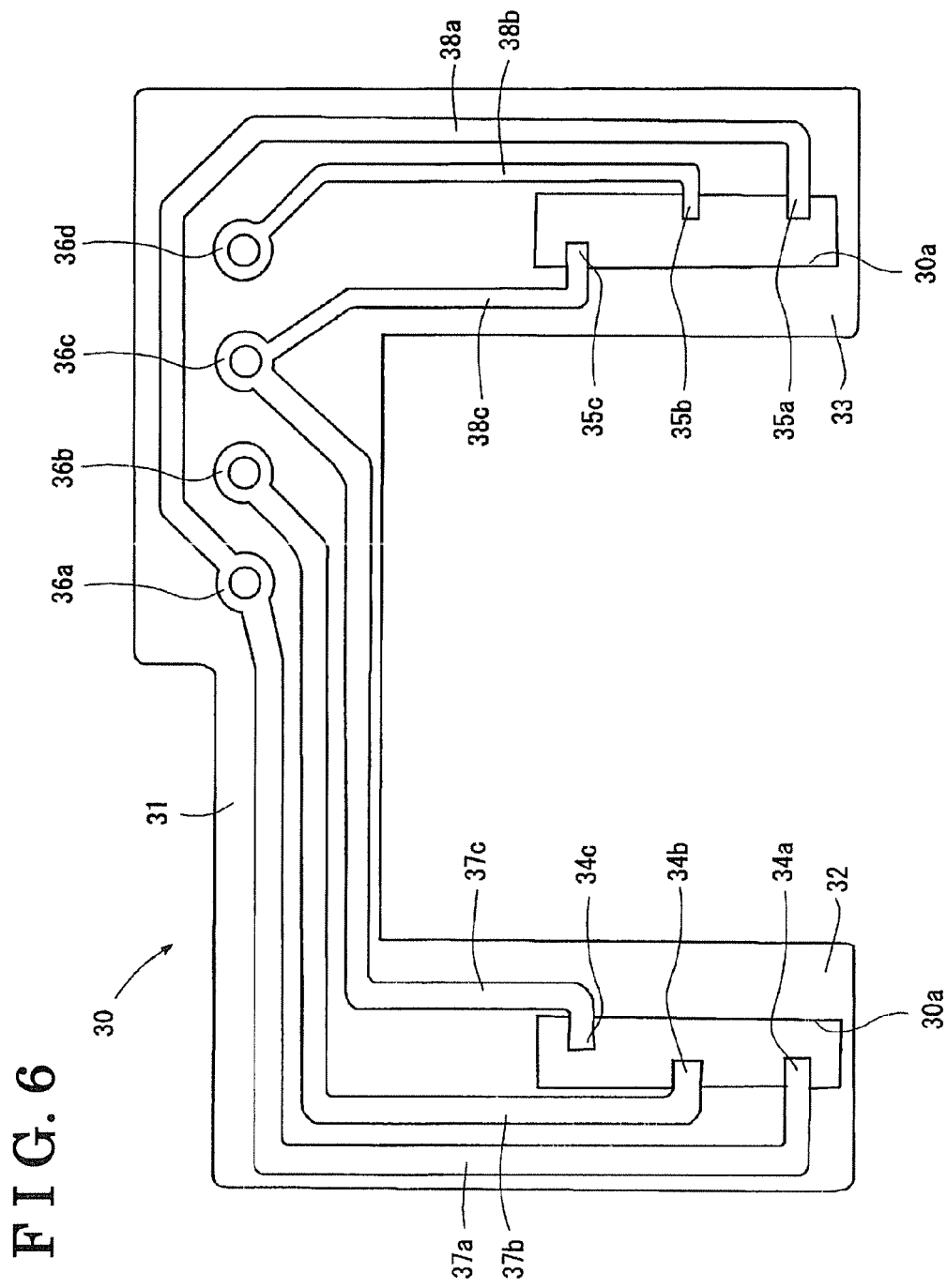
FIG. 6 is a front view illustrating an FPC substrate of the occupant load sensor according to the embodiment of the present invention.

In addition, as illustrated in FIG. 6, the FPC substrate 30 is in U-shape. The FPC substrate 30 includes a body portion 31 and leg portions 32, 33 extending from both end portions of the body portion 31. The FPC substrate 30 further includes terminals 34*a*, 34*b*, 34*c* formed at the leg portion 32, and terminals 35*a*, 35*b*, 35*c* formed at the leg portion 33. Still further, the FPC substrate 30 includes through-holes 36*a*, 36*b*, 36*c* and 36*d* formed at the body portion 31 and a plurality of wiring patterns 37*a*, 37*b*, 37*c*, 38*a*, 38*b*, and 38*c*. The terminals 34*a* and 35*a* are connected to the through hole 36*a* of the body portion 31 via the wiring patterns 37*a* and 38*a*, respectively. The terminal 34*b* is connected to the through-hole 36*b* via the wiring pattern 37*b*, and the terminal 35*b* is connected to the through-hole 36*d* via the wiring pattern 38*b*. Further, the terminals 34*c* and 35*c* are connected to the through-hole 36*c* via the wiring patterns 37*c* and 38*c*, respectively. The width of each wiring pattern 37*a*, 37*b*, 37*c*, 38*a*, 38*b* and 38*c* is in proportion to the length of each wiring pattern, i.e., the longer the length of the wiring pattern is, the wider the width of the wiring pattern is. For example, the width of the wiring patterns 37*a*, 37*b* and 37*c* are wider than that of the wiring patterns 38*a*, 38*b* and 38*c*, respectively.

Figure 7:
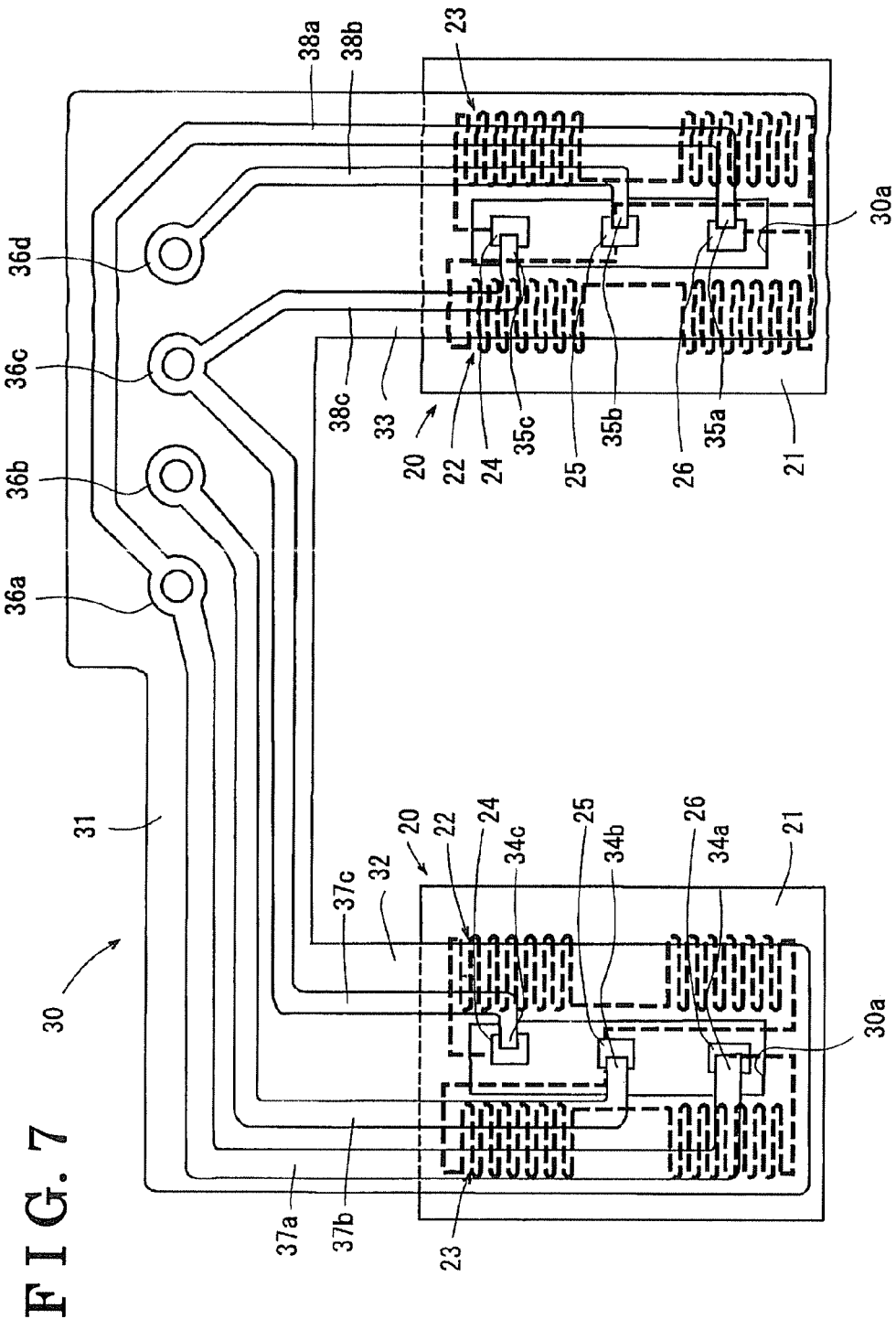
FIG. 7 is a schematic view illustrating an assembling state of the strain gauge plates and the FPC substrate of the occupant load sensor according to the embodiment of the present invention.

FIG. 7 is a schematic view illustrating the two strain gauge plates 20 connected to the FPC substrate 30. As illustrated therein, the terminals 24, 25 and 26 (lands) of one strain gauge plate 20 (the first strain gauge plate) are respectively integrally soldered to the terminals 34*c*, 34*b* and 34*a*, which respectively protrude from the wiring patterns 37*a*, 37*b*, 37*c* into one of holes 30*a* formed at the FPC substrate 30. In the same manner, the terminals 24, 25 and 26 (lands) of the other strain gauge plate 20 (the second strain gauge plate) are respectively integrally soldered to the terminals 35*c*, 35*b* and 35*a* which respectively protrude from the wiring patterns 38*a*, 38*b*, 38*c* into the other of the holes 30*a* formed at the FPC substrate 30. Accordingly, the strain gauge plates 20 are connected to the FPC substrate 30. In a state where the strain gauge plates 20 are attached to the strain member 10, the terminals 24, 25 and 26 of each strain gauge plate 20 are aligned in the lateral direction of the strain member 10 (see FIGS. 4 and 5). In addition, in the state where the strain gauge plates 20 are attached to the strain member 10, the wiring patterns 37*a*, 37*b*, 37*c*, 38*a*, 38*b* and 38*c*, all which are formed at the FPC substrate 30, are formed at both longitudinal directions of the strain member 10, and extend in a lateral direction thereof being perpendicular to the longitudinal direction.

Figure 8:
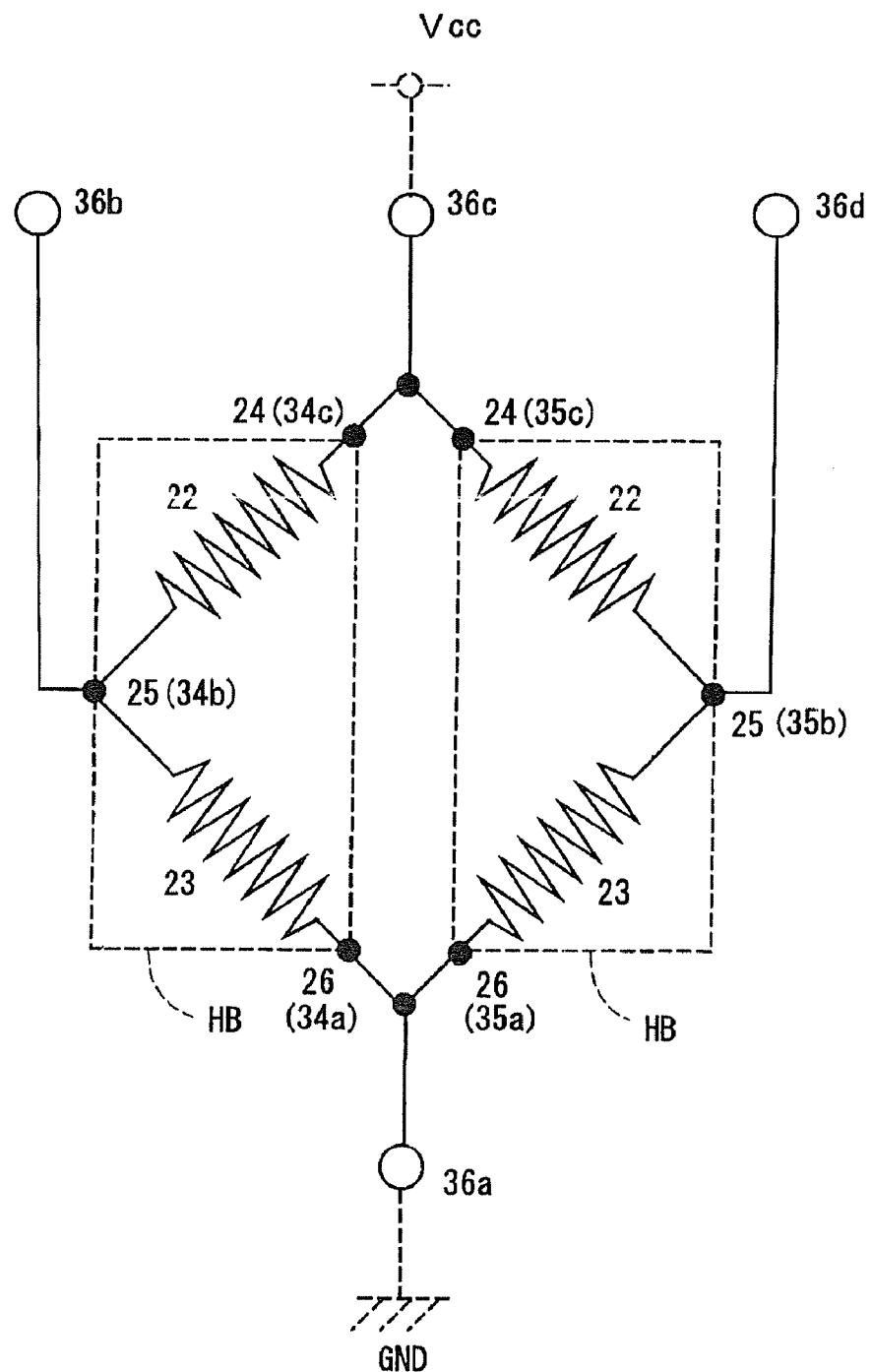
FIG. 8 is a schematic diagram illustrating a circuit formed by the strain gauge plates and the FPC substrate of the occupant load sensor according to the embodiment of the present invention.

FIG. 8 is a circuit diagram illustrating a state where the two strain gauge plates 20 are connected to the FPC substrate 30. As shown in FIG. 8, a Wheatstone bridge circuit is formed by two half bridge circuits HB, which are respectively formed by the strain detecting elements 22 and 23 on the corresponding strain gauge plate 20, and the wiring patterns 37a to 37c and 38a to 38c, formed on the FPC substrate 30. Additionally, the through hole 36a is connected to a ground GND and the through hole 36c is connected to an electric source Vcc. Further, the through holes 36b, 36d are connected to the amplifying circuit of the amplifier substrate 51, as a signal output of the Wheatstone bridge circuit.

According to the occupant load sensor of the seat for the vehicle with the above described configuration, when the occupant is seated on the seat 90, the load of the occupant is applied to the frame 96 fixed with the seat cushion 91. Therefore, the load is applied to each strain member 10 of each of the four occupant load sensors 1 (FR, FL, RR, RL) via the corresponding connecting shaft 40. Then, at each area between the connecting shaft 40 and each first and second lower bracket 42, 43 on the surface of the strain member 10, compressive strain is generated at the side of the first and second lower brackets 42, 43, and tensile strain is generated at the side of the connecting shaft 40. The compressive strain and the tensile strain are proportional to the load of the occupant to the strain member 10. Then, the compressive strain and the tensile strain are detected by the strain detecting elements 22, 23 as changes of electrical resistance and are transformed to electric voltage by the Wheatstone bridge circuit. The electric voltage output which is outputted from the Wheatstone bridge is weak so that the amplifying circuit of the amplifier substrate 51 amplifies the electric voltage output. The electric voltage output amplified by the amplifying circuit is changed to the digital signal by the A/D converter circuit of the amplifier substrate 51 and is transmitted to the outside by the sending circuit of the amplifier substrate 51. As described above, the load of the occupant seated on the seat 90 is obtained as the digital signal output from the amplifier substrate 51.

According to the occupant load sensor 1 of the embodiment, the Wheatstone bridge is formed by the half bridge circuits HB respectively formed by the strain gauge plates 20 and wiring patterns 37a to 37c and 38a to 38c formed on the FPC substrate 30. Further, the wiring patterns 37a to 37c and 38a to 38c connected to the Wheatstone bridge circuit from the amplifier substrate 51 are formed on the FPC substrate 30. Accordingly, even when the strain member 10 is deformed by receiving an external load, the wiring patterns 37a to 37c and 38a to 38c are hardly deformed and additionally, there is no need to consider a contact of the strain detecting members 22, 23 with the wiring patterns 37a to 37c and 38a to 38c. Therefore, according to the occupant load sensor of the seat for the vehicle of the present invention, the load of the occupant seated on the seat is precisely measured and further, it is possible to downsize the occupant load sensor.

In addition, according to the occupant load sensor 1 of the seat for the vehicle, the terminals (lands) 24, 25 and 26, which connect each strain gauge plate 20 with the FPC substrate 30, are positioned at a central portion of the corresponding strain gauge plate 20 and are perpendicularly aligned relative to the longitudinal direction of the strain member 10. The positions, where the terminals (lands) 24, 25 and 26 of each strain gauge plate 20 are provided, are hardly deformed even when the strain member 10 deforms. Accordingly, a poor contacting hardly occurs. In addition, the wiring patterns 37a to 37c and 38a to 38c are formed at both sides of the strain member 10 in the longitudinal direction thereof, so that it may be possible to downsize the width of the strain member 30.

Still further according to the occupant load sensor 1 of the seat for the vehicle of the present invention, each width of each wiring patterns 37a to 37c and 38a to 38c is in proportion with each length thereof. Accordingly, resistance of each of the wiring patterns 37a to 37c and 38a to 38c can be made equal in the respective two half bridge circuits HB formed at the strain gauge plates 20, and the load of the occupant seated on the seat 90 can be precisely measured.

Additionally according to the embodiment described above, first and second lower brackets 42, 43 are fixedly mounted on the upper rails 95 of the seat sliding apparatus and the connecting shaft 40 is fixedly attached to the frame 96. Alternatively, however, the first and second lower brackets 42, 43 may be fixedly attached to the frame 96 and the connecting shaft 40 may be fixedly mounted on the upper rail 95.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. An occupant load sensor of a seat for a vehicle, comprising:
    a strain member arranged between a floor-side fixing member adapted to be fixedly mounted on a floor and a seat-side fixing member adapted to be fixedly attached to a seat for the vehicle and securely attached to one of the floor-side fixing member and the seat-side fixing member at both end portions in a front and rear direction of the seat;
    a connecting member fixed to a central portion of the strain member in a vertical direction and securely connected to the other one of the floor-side fixing member and the seat-side fixing member;
    first and second strain gauge plates attached to a surface of the strain member, the first strain gauge plate being arranged between the central portion of the strain member and one end portion of the strain member, the second strain gauge plate being arranged between the central portion of the strain member and the other end portion of the strain member, each first and second strain gauge plate including two strain detecting elements forming a half bridge circuit of a Wheatstone bridge circuit;
    an upper bracket including fixing portions respectively formed at end portions of the upper bracket and fixed to respective end portions of the strain member, the upper bracket comprising an attachment portion connecting the fixing portions of the upper bracket, the attachment portion being laterally offset relative to the strain member so that the attachment portion of the upper bracket and the strain member do not overlap one another;
    an amplifier substrate housed in an amplifier case attached to the attachment portion of the upper bracket in parallel with the strain member and amplifying a signal of the strain gauge plates; and an FPC substrate connected to the strain gauge plates, the amplifier substrate overlapping the attachment portion of the upper bracket, and the amplifier substrate which overlaps the attachment portion of the upper bracket being connected to the FPC substrate, the FPC substrate including plural wiring patterns forming the Wheatstone bridge circuit with each half bridge circuit of the Wheatstone bridge circuit formed at each first and second strain gauge plate.

2. An occupant load sensor of a seat for a vehicle according to claim 1, wherein plural terminals protrude from a central portion of each of the first and second strain gauge plates and are aligned in a lateral direction of the strain member, the plural terminals of each strain gauge plate are respectively soldered at a plurality of terminals provided on the FPC substrate so that the strain gauge plate and the FPC substrate are connected with one another.

3. An occupant load sensor of a seat for a vehicle according to claim 2, wherein the plural wiring patterns comprise plural wiring patterns at each side of the strain member in a lengthwise direction of the strain member, and the plural windings at each side extend in a lateral direction from the plural terminals of one of the strain gauge plates.

4. An occupant load sensor of a seat for a vehicle according to claim 2, wherein each wiring pattern possesses a width and a length, and wherein the width of each wiring pattern is proportional to the length of the wiring pattern.

5. An occupant load sensor of a seat for a vehicle according to claim 1, wherein each wiring pattern possesses a width and a length, and wherein the width of each wiring pattern is proportional to the length of the wiring pattern.

6. An occupant load sensor of a seat for a vehicle according to claim 1, wherein the FPC substrate having the wiring patterns is fixed to the attachment portion of the upper bracket.

7. An occupant load sensor of a seat for a vehicle according to claim 1, wherein the plural wiring patterns comprise first and second wiring patterns each possessing a width and a length, the width of the first wiring pattern being greater than the width of the second wiring pattern, the length of the first wiring pattern being greater than the length of the second wiring pattern.

8. An occupant load sensor of a seat for a vehicle according to claim 1, wherein the plural wiring patterns comprise first, second and third wiring patterns each possessing a width and a length, the width of the first wiring pattern being greater than the width of the second wiring pattern, the width of the second wiring pattern being greater than the width of the third wiring pattern, the length of the first wiring pattern being greater than the length of the second wiring pattern, the length of the second wiring pattern being greater than the length of the third wiring pattern.

9. An occupant load sensor of a seat for a vehicle, comprising:
a strain member arranged between a floor-side fixing member adapted to be fixedly mounted on a floor and a seat-side fixing member adapted to be fixedly attached to a seat for the vehicle and securely attached to one of the floor-side fixing member and the seat-side fixing member at both end portions in a front and rear direction of the seat;
a connecting member fixed to a central portion of the strain member in a vertical direction and securely connected to the other one of the floor-side fixing member and the seat-side fixing member;
first and second strain gauge plates attached to a surface of the strain member, the first strain gauge plate being arranged between the central portion of the strain member and one end portion of the strain member, the second strain gauge plate being arranged between the central portion of the strain member and the other end portion of the strain member, each first and second strain gauge plate including two strain detecting elements forming a half bridge circuit of a Wheatstone bridge circuit;
an upper bracket including fixing portions respectively formed at end portions of the upper bracket and fixed to respective end portions of the strain member, the upper bracket comprising an attachment portion connecting the fixing portions of the upper bracket and extending laterally to one side of the strain member;
an amplifier substrate housed in an amplifier case attached to the attachment portion of the upper bracket in parallel with the strain member and amplifying a signal of the strain gauge plates;
an FPC substrate connected to the amplifier substrate and to the strain gauge plates, the FPC substrate including a plurality of wiring patterns forming the Wheatstone bridge circuit with each half bridge circuit of the Wheatstone bridge circuit formed at each first and second strain gauge plate; and
plural terminals protruding from a central portion of each of the first and second strain gauge plates, the plural terminals being aligned in a lateral direction of the strain member, the plural terminals of each strain gauge plate being respectively soldered at a plurality of terminals on the FPC substrate so that the strain gauge plate and the FPC substrate are connected with one another.

10. An occupant load sensor of a seat for a vehicle according to claim 9, wherein the plural wiring patterns comprise plural wiring patterns at each side of the strain member in a lengthwise direction of the strain member, and the plural windings at each side extend in a lateral direction from the plural terminals of one of the strain gauge plates.

11. An occupant load sensor of a seat for a vehicle according to claim 10, wherein each wiring pattern possesses a width and a length, and wherein the width of each wiring pattern is proportional to the length of the wiring pattern.

12. An occupant load sensor of a seat for a vehicle according to claim 9, wherein each wiring pattern possesses a width and a length, and wherein the width of each wiring pattern is proportional to the length of the wiring pattern.

13. An occupant load sensor of a seat for a vehicle according to claim 9, wherein the plural wiring patterns comprise first and second wiring patterns each possessing a width and a length, the width of the first wiring pattern being greater than the width of the second wiring pattern, the length of the first wiring pattern being greater than the length of the second wiring pattern.

14. An occupant load sensor of a seat for a vehicle according to claim 9, wherein the plural wiring patterns comprise first, second and third wiring patterns each possessing a width and a length, the width of the first wiring pattern being greater than the width of the second wiring pattern, the width of the second wiring pattern being greater than the width of the third wiring pattern, the length of the first wiring pattern being greater than the length of the second wiring pattern, the length of the second wiring pattern being greater than the length of the third wiring pattern.

* * * * *